United States Patent
Ishida et al.

(10) Patent No.: US 11,887,822 B2
(45) Date of Patent: Jan. 30, 2024

(54) EDGE RING AND ETCHING APPARATUS

(71) Applicant: Tokyo Electron Limited, Tokyo (JP)

(72) Inventors: Toshifumi Ishida, Miyagi (JP); Yusuke Saitoh, Mie (JP)

(73) Assignee: Tokyo Electron Limited, Tokyo (JP)

( * ) Notice: Subject to any disclaimer, the term of this patent is extended or adjusted under 35 U.S.C. 154(b) by 381 days.

(21) Appl. No.: 17/367,948

(22) Filed: Jul. 6, 2021

(65) Prior Publication Data

US 2022/0013338 A1    Jan. 13, 2022

Related U.S. Application Data

(60) Provisional application No. 63/048,776, filed on Jul. 7, 2020.

(30) Foreign Application Priority Data

May 27, 2021    (JP) ................................ 2021-089366

(51) Int. Cl.
*H01J 37/32* (2006.01)

(52) U.S. Cl.
CPC .. *H01J 37/32642* (2013.01); *H01J 37/32568* (2013.01); *H01J 37/32715* (2013.01); *H01J 2237/3341* (2013.01)

(58) Field of Classification Search
CPC ........... H01J 37/32642; H01J 37/32568; H01J 37/32715; H01J 2237/3341; H01J 37/32633; H01J 2237/334; C23C 16/4481; C23C 16/4402

USPC .......... 118/728, 723 R, 723 MP, 723 E, 726; 156/345.35, 345.36, 345.14, 345.51

See application file for complete search history.

(56) References Cited

U.S. PATENT DOCUMENTS

| | | | |
|---|---|---|---|
| 2007/0169891 A1* | 7/2007 | Koshiishi | H01L 21/68757 156/345.47 |
| 2010/0041240 A1* | 2/2010 | Tsujimoto | H01J 37/32642 156/345.43 |
| 2015/0056808 A1 | 2/2015 | Ogasawara et al. | |
| 2020/0335376 A1* | 10/2020 | Sun | H01L 21/68735 |
| 2022/0351947 A1* | 11/2022 | Yoon | H01J 37/32642 |

FOREIGN PATENT DOCUMENTS

| | | |
|---|---|---|
| JP | 2007-258417 | 10/2007 |
| JP | 2015-041624 | 3/2015 |

* cited by examiner

*Primary Examiner* — Rudy Zervigon
(74) *Attorney, Agent, or Firm* — IPUSA, PLLC

(57) ABSTRACT

An edge ring includes a ramp surface of which a height decreases from an outer edge-side portion toward an inner edge-side portion. The edge ring is configured to satisfy the relation of T2/T1>T4/T3. Where, T1 is a thickness of the edge ring, before plasma treatment, at a first position on the ramp surface of the inner edge-side portion, and T2 is a thickness of the edge ring, before plasma treatment, at a second position on the ramp surface of the outer edge-side portion. T3 is a thickness of the edge ring, after plasma treatment, at the first position, and T4 is a thickness of the edge ring, after plasma treatment, at the second position.

6 Claims, 7 Drawing Sheets

S —◦— EDGE RING IN REFERENCE EXAMPLE
T —•—  EDGE RING ACCORDING TO ONE EMBODIMENT

RATIO OF ELECTRIC FIELD STRENGTH
AT INNER EDGE-SIDE PORTION
TO ELECTRIC FIELD STRENGTH AT
OUTER EDGE-SIDE PORTION

|  |  | RATIO FOR ELECTRIC FIELD STRENGTH | RATIO FOR CONSUMPTION RATE |
|---|---|---|---|
| ONE EMBODIMENT | T1-inner | 0.71 | 0.6 |
|  | T1-outer | 1 | 0.9 |
| REFERENCE EXAMPLE | F1-inner | 0.93 | 1 |
|  | F1-outer | 1 | 1 |

EDGE RING AND ETCHING APPARATUS

CROSS-REFERENCE TO RELATED APPLICATIONS

This patent application claims the benefit under 35 U.S.C. § 119 of Provisional Application No. 63/048,776, filed Jul. 7, 2020, and claims priority to Japanese Patent Application No. 2021-089366, filed May 27, 2021. The contents of these applications are incorporated herein by reference in their entirety.

TECHNICAL FIELD

The present disclosure relates to an edge ring and an etching apparatus.

BACKGROUND

Plasma treatment such as etching results in consumption of edge rings, which are components located near substrates. As thicknesses of the edge rings are decreased due to the consumption of the edge rings, the shapes of sheaths at tops of the edge rings change, and consequently ions from a plasma are incident inside edge regions of the substrates, relative to a vertical direction (i.e., the ions tilt). As a result, a failure of plane uniformity within the substrates, by plasma treatment, may occur. Consumption of peripheral side sides of the edge rings near the edge regions of the substrates greatly influences the tilt of the ions from the plasma. Thus, the edge rings can be desirable to suppress the consumption of the peripheral side sides of the edge rings. Note that the edge rings are also referred to as focus rings.

For example, Japanese Unexamined Patent Application No. 2007-258417, which is referred to as Patent document 1, discloses a plasma processing method, and with the plasma processing method, negative influence in a processed result, such as the shape of an etched substrate caused by consumption of a focus ring, is mitigated to the extent possible, and a lifetime of the focus ring can be increased. In Patent document 1, a DC power source is connected to the focus ring, and a predetermined DC voltage is applied to the focus ring based on the degree of consumption of the focus ring, a detected result of changes in an electric field above the focus ring, or a previously obtained result by plasma treatment.

SUMMARY

According to one aspect of the present disclosure, an edge ring to encircle an etching object supported by a substrate support in a plasma processing chamber is provided. The edge ring includes an inner edge-side portion toward the innermost circumference of the edge ring, relative to an intermediate line that is equidistant from the innermost circumference and the outermost circumference of the edge ring. The edge ring includes an outer edge-side portion toward the outermost circumference of the edge ring, relative to the intermediate line. The inner edge-side portion and the outer edge-side portion have a ramp surface of which a height decreases from the outer edge-side portion toward the inner edge-side portion. The edge ring are configured to satisfy the relation of $T2/T1 > T4/T3$, where T1 is a thickness of the edge ring, before plasma treatment, at a first position on the ramp surface of the inner edge-side portion, and T2 is a thickness of the edge ring, before plasma treatment, at a second position on the ramp surface of the outer edge-side portion. T3 is a thickness of the edge ring, after plasma treatment, at the first position, and T4 is a thickness of the edge ring, after plasma treatment, at the second position.

DETAILED DESCRIPTION

One or more embodiments of the present disclosure will be described with reference to the drawings. In each drawing, the same numerals denote the same components, and duplicate description for the components may be omitted.

[Edge Ring]

Figure 1A:
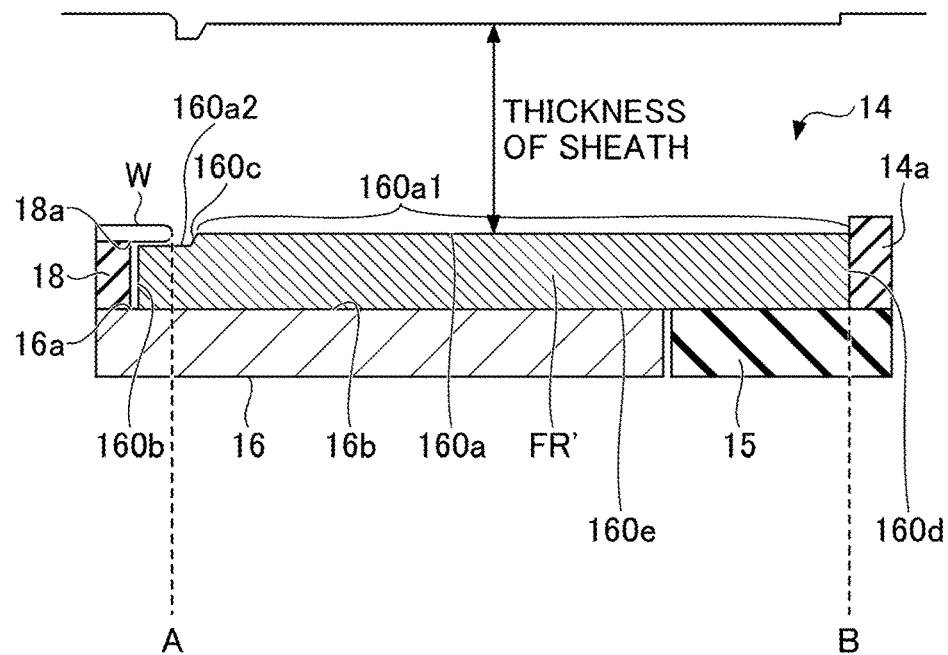
FIG. 1A illustrates an edge ring in a reference example.
Figure 1B:
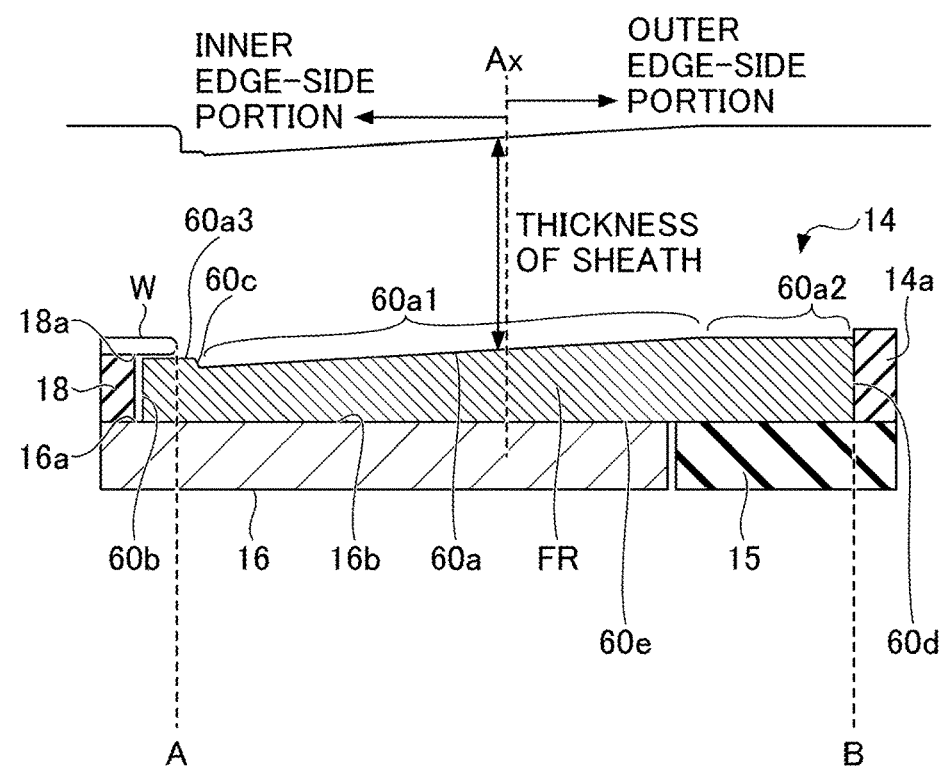
FIG. 1B illustrates an edge ring according to one embodiment.
Figure 2:
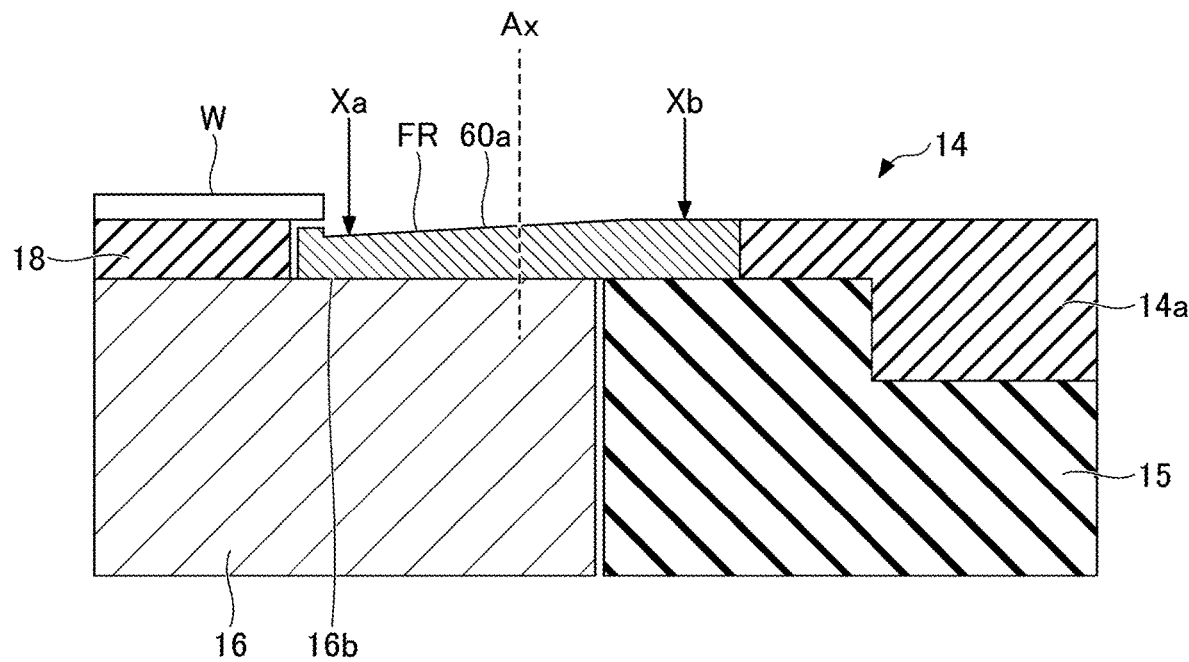
FIG. 2 is a cross-sectional view illustrating an example of the surroundings of the edge ring according to one embodiment.

An edge ring FR according to one embodiment will be described with reference to FIG. 1A to FIG. 2. FIG. 1A is a diagram illustrating an edge ring FR' in a reference example. FIG. 1B is a diagram illustrating an example of an edge ring FR according to one embodiment. FIG. 2 is a cross-sectional view illustrating an example of the edge ring FR and the surrounding components according to one embodiment.

Figure 8:
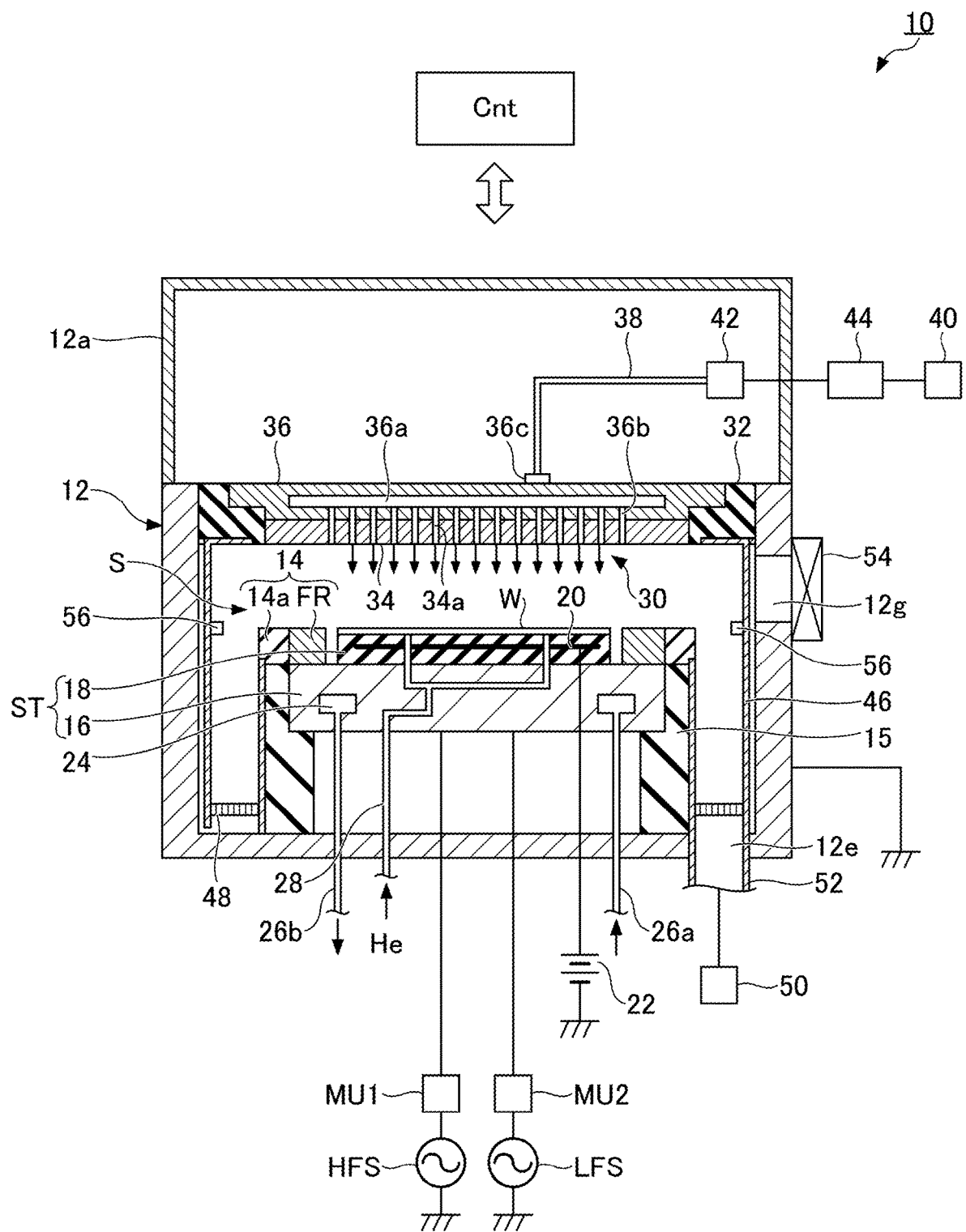
FIG. 8 is a cross-sectional view schematically illustrating an example of an etching apparatus according to one embodiment.

The edge ring FR is an annular member arranged to surround an outer edge of a substrate (hereinafter referred to as a "wafer W"), which is an example of an etching object supported by a substrate support ST in a plasma processing chamber 12 of an etching apparatus 10 (see FIG. 8). The edge ring FR is formed of, for example, a conductive material such as Si or SiC. A cover ring 14a is an annular member arranged to surround an outer edge of the edge ring FR. For example, the cover ring 14a is formed of an insulating material such as quartz. The etching apparatus 10 is an apparatus that performs plasma treatment (etching) with respect to a given etching object (target etching film) on the wafer W. The substrate support ST includes a base 16 and an electrostatic chuck 18. Another configuration of the etching apparatus 10 will be described below.

Hereafter, the edge ring FR' in the reference example in FIG. 1A and the edge ring FR (hereinafter also referred to as a taper FR) according to one embodiment in FIG. 1B will be described. Although the edge ring FR according to one embodiment differs from the edge ring FR' in the reference example with respect to the shape of the top surface of the edge rings, the shapes of the other surfaces of the edge rings are the same.

As illustrated in FIG. 1A, the longitudinal section of the edge ring FR' in the reference example is a plane surrounded by contour lines determined when an inner edge 160b, an outer edge 160d, a bottom 160e connecting a lowest point of the inner edge 160b and a lowest point of the outer edge 160d, and a top 160a connecting a highest point of the inner edge 160b and a highest point of the outer edge 160d are cut in a radial direction of the edge ring FR'. The top 160a of the edge ring FR' includes a surface 160a1, a surface 160a2, and a stepped portion 160c.

As illustrated in FIG. 1B, the longitudinal section of the edge ring FR according to one embodiment is a plane surrounded by contour lines set when an inner edge 60b, an outer edge 60d, a bottom 60e connecting a lowest point of the inner edge 60b and a lowest point of the outer edge 60d, and a top 60a connecting a highest point of the inner edge 60b and a highest point of the outer edge 60d are cut in a radial direction of the edge ring FR. The top 60a of the edge ring FR includes a surface 60a1, a surface 60a2, a surface 60a3, and a stepped portion 60c. Note that in FIG. 1B, when the inner edge 60b and the outer edge 60d of the edge ring FR are viewed from a horizontal direction, the side of the edge ring FR located farther inward than an intermediate line Ax, which is equidistant from the inner edge 60b and the outer edge 60d of the edge ring FR, is referred to as an inner edge-side portion. Also, when the inner edge 60b and the outer edge 60d of the edge ring FR are viewed from the horizontal direction, the side of the edge ring FR located farther outward than the intermediate line Ax is referred to as an outer edge-side portion. Likewise, in FIG. 1A, when the inner edge 160b and the outer edge 160d of the edge ring FR' are viewed from a horizontal direction, the side of the edge ring FR' located farther inward than an intermediate line not illustrated, which is equidistant from the inner edge 160b and the outer edge 160d of the edge ring FR', is referred to as an inner edge-side portion. Also, when the inner edge 160b and the outer edge 160d of the edge ring FR' are viewed from a horizontal direction, the side of the edge ring FR' located farther outward than the intermediate line is referred to as an outer edge-side portion.

In FIG. 1A, in the edge ring FR' supported by a base 16 and an annular member 15, the surface 160a1 and the surface 160a2 of the top 160a are horizontal planes. In FIG. 1B, in the edge ring FR supported by a base 16 and an annular member 15, the surface 60a2 and the surface 60a3 of the top 60a are horizontal planes, and the surface 60a1 is a ramp surface of which the height decreases from the outer edge toward the inner edge of the edge ring FR. In FIG. 1A, the bottom 160e of the edge ring FR' is substantially parallel to the surface 160a1 and the surface 160a2 of the edge ring FR'. Likewise, in FIG. 1B, the bottom 60e of the edge ring FR is substantially parallel to the surface 60a2 and the surface 60a3 of the edge ring FR. In the specification, the term "horizontal plane" used as a given surface of the edge ring FR' means that when the edge ring FR' is mounted on a ring supporting surface 16b of the base 16, the surface 160a1 and the surface 160a2 of the edge ring FR' are horizontally provided. Likewise, the term "horizontal plane" as a given surface of the edge ring FR means that when the edge ring FR is mounted on a ring supporting surface 16b of the base 16, the surface 60a2 and the surface 60a3 of the edge ring FR are horizontally provided. Moreover, the term "ramp surface" used in the specification means that when the edge ring FR is mounted on the ring supporting surface 16b of the base 16, the surface 60a1 of the edge ring FR is ramped such that the height of the surface decreases from the outer edge toward the inner edge of the edge ring FR.

In FIG. 1A and FIG. 1B, each base 16 includes a central region (central supporting surface 16a) for supporting a corresponding electrostatic chuck 18 and includes an annular region (ring supporting surface 16b) for supporting a corresponding edge ring among the edge ring FR and the edge ring FR'. The ring supporting surface 16b of each base 16 surrounds the central supporting surface 16a in a plan view. The electrostatic chuck 18 is disposed on the central supporting surface 16a of each base 16, and a corresponding edge ring among the edge ring FR and the edge ring FR' is disposed on the ring supporting surface 16b of each base 16.

Each base 16 also includes a conductive member. The conductive member of each base 16 serves as a bottom electrode. A top of each electrostatic chuck 18 has a given substrate supporting surface 18a, and a given wafer W is disposed on the substrate supporting surface 18a of each electrostatic chuck 18. Each of the edge ring FR and the edge ring FR' is disposed to encircle the given wafer W on the electrostatic chuck 18.

As illustrated in FIG. 2, a ring assembly 14 includes the edge ring FR and the cover ring 14a. A portion of the edge ring FR and the cover ring 14a are supported by the annular member 15. The annular member 15 is formed of an insulator such as quartz. The annular member 15 is configured to surround the outer periphery of the base 16.

The height (thickness) of the edge ring FR on the outermost circumference and the height (thickness) of the cover ring 14a on the innermost circumference are approximately the same. In other words, there is no stepped portion between the top of the edge ring FR on the outermost circumference thereof and the top of the cover ring 14a on the circumference thereof. A ring-shaped bottom of the cover ring 14a partially protrudes downward, so that the bottom of the cover ring 14 provided toward the outer periphery thereof is lower than the bottom of the cover ring 14 provided toward the inner periphery thereof. The bottom of the cover ring 14a provided toward the outer periphery thereof engages with a cut-out portion of the top of the annular member 15 provided toward the outer periphery thereof. Note that the edge ring FR may be disposed on the ring supporting surface 16b of the base 16, through a heat transfer sheet.

Referring now to FIG. 1A, the edge ring FR' is configured such that the outer edge of the wafer W extends beyond the inner edge 160b of the edge ring FR'. The stepped portion 160c, which is proximal to the outer edge of the wafer W, is formed farther outward than the outer edge of the wafer W. The surface 160a2 of the top 160a provided between the innermost circumference of the edge ring FR' and the stepped portion 160c is a uniformly horizontal plane. In FIG. 1B, the edge ring FR is configured such that the outer edge of the wafer W extends beyond the inner edge 60b of the edge ring FR. The stepped portion 60c, which is proximal to the outer edge of the wafer W, is formed farther outward than the outer edge of the wafer W. The surface 60a3 of the top 60a provided between the innermost circumference of the edge ring FR and the stepped portion 60c is a uniformly horizontal plane. In this description, the surface 60a3 is a first surface.

In FIG. 1A, the top 160a of the edge ring FR' has the surface 160a2, which is provided between the innermost circumference of the edge ring FR' and the stepped portion 160c, and has the surface 160a1, which is provided between the stepped portion 160c and the outermost circumference of the edge ring FR'. A width of the surface 160a2 is approximately between 1 mm and 2 mm, which is measured from the highest point of the inner edge 160b of the edge ring FR'. The edge ring FR' provided between the inner edge 160b and the stepped portion 160c of the edge ring FR' has a constant thickness. Also, the edge ring FR' provided between the stepped portion 160c and the outer edge 160d of the edge ring FR' has a constant thickness. The edge ring FR' provided between the stepped portion 160c and the outer edge 160d of the edge ring FR' is thicker than the edge ring FR' provided between the inner edge 160b and the stepped portion 160c of the edge ring FR'. That is, the height of the surface 160a1 of the edge ring FR' toward the outer edge, relative to the stepped portion 160c, is higher than that of the surface 160a2 of the edge ring FR' toward the inner edge, relative to the stepped portion 160c.

In contrast, in FIG. 1B, the top 60a of the edge ring FR according to one embodiment has a first surface 60a3 provided between the inner edge 60b and the stepped portion 60c of the edge ring FR. The top 60a of the edge ring FR also has a ramp surface 60a1 and a second surface 60a2, which are provided outside the stepped portion 60c. The width of the surface 60a3 is approximately between 1 mm and 2 mm, which is measured from the highest point of the inner edge 60b of the edge ring FR. The first surface 60a3 and the second surface 60a2 of the edge ring FR are horizontal planes, when they are provided on the ring supporting surface 16b of the base 16. In such a manner, the edge ring FR provided between the inner edge 60b and the stepped portion 60c has a constant thickness. The second surface 60a2 of the edge ring FR provided on the ring supporting surface 16b of the base 16 may be a horizontal plane or a ramp surface. The ramp surface 60a1 of the edge ring FR is a surface between the first surface 60a3 and the second surface 60a2. Each of the first surface 60a3 and the second surface 60a2 of the edge ring FR is flat, and the ramp surface 60a1 of the edge ring FR is uniformly ramped. A smaller thickness of the edge ring FR provided at an outer edge of the stepped portion 60c is set in comparison to the thickness of the edge ring FR provided at an inner surface of the stepped portion 60c. The thickness of the edge ring FR provided farther outward than the stepped portion 60c increases toward the outer circumference of the ramp surface 60a of the edge ring FR, and a greater thickness of the edge ring FR provided on the outer circumference of the ramp surface 60a of the edge ring FR is set in comparison to the thickness of the edge ring FR provided farther inward than the stepped portion 60c.

According to the configuration, in the edge ring FR' in the reference example in FIG. 1A, the edge ring FR' provided farther outward than the stepped portion 160c has a constant thickness. In contrast, in the edge ring FR according to one embodiment described in FIG. 1B, the thickness of the edge ring FR provided farther outward than the stepped portion 60c further increases outward (see the ramp surface 60a1).

Accordingly, the thickness of the edge ring FR' between the inner edge 160b and the stepped portion 160c is constant, and the thickness of the edge ring FR between the inner edge 60b and the stepped portion 60c is also constant. However, the height, from the top of a given wafer W, of the edge ring FR outside the stepped portion 60c relatively differs from the height of the edge ring FR' outside the stepped portion 160c. That is, in the reference example in FIG. 1A, because the top 160a of the edge ring FR' outside the stepped portion 160c is a horizontal plane, the height of the top 160a of the edge ring FR', relative to the top of the given wafer W, is constant. In contrast, in one embodiment described in FIG. 1B, the height of at least the ramp surface 60a1 of the top 60a of the edge ring FR outside the stepped portion 60c, relative to the top of the given wafer W, is decreased from the outer circumference of the ramp surface 60a1 toward the inner circumference thereof.

As described below, radio frequency power from at least one among a first ratio frequency power source HFS and a second ratio frequency power source LFS is applied to the base 16 of each of the edge ring FR and the edge ring FR' (see FIG. 8). Thus, a radio frequency current (RF current) flows through each of the edge ring FR and the edge ring FR'.

Under the same condition, when a given sheath provided on each of the edge ring FR and the edge ring FR' is caused by the radio frequency current, an electric field strength at the given sheath is entirely constant. In such a case, for example, the electric field strength cannot be zero. By varying the height of a portion of the top 60a of the edge ring FR provided farther outward than the stepped portion 60c, a given electric field strength at the inner edge-side portion and a given electric field strength at the outer edge-side portion of the edge ring FR' can relatively change. Likewise, if the height of the top 160a of the edge ring FR provided farther outward than the stepped portion 160c varies, a given electric field strength at the inner edge-side portion and a given electric field strength at the outer edge-side portion of the edge ring FR' could relatively change.

However, for example, in the edge ring FR' in the reference example, the height of a portion of the top 160a provided farther outward than the stepped portion 160c, relative to the top of the given wafer W, is constant, and consequently a rate of the current flowing through a surface layer of the outer edge-side portion of the edge ring FR' is approximately the same as that of the current flowing through a surface layer of the inner edge-side portion of the edge ring FR'. As a result, the electric field strength at a given sheath toward the outer edge-side portion of the edge ring FR' might be approximately the same as that at a given sheath toward the inner edge-side portion of the edge ring FR'.

In contrast, in the edge ring FR according to one embodiment, a smaller height of the ramp surface 60a1 on the inner circumference thereof, relative to the top of the given wafer W, is set in comparison to the height of the ramp surface 60a1 on the outer circumference thereof, relative to the top of the given wafer W. In such a case, the current flowing through a given surface layer of the edge ring FR changes relatively. Thus, a greater electric field strength at a given sheath toward the outer edge-side portion of the edge ring FR is set in comparison to the electric field strength at a given sheath toward the inner edge-side portion of the edge ring FR.

Figure 3:
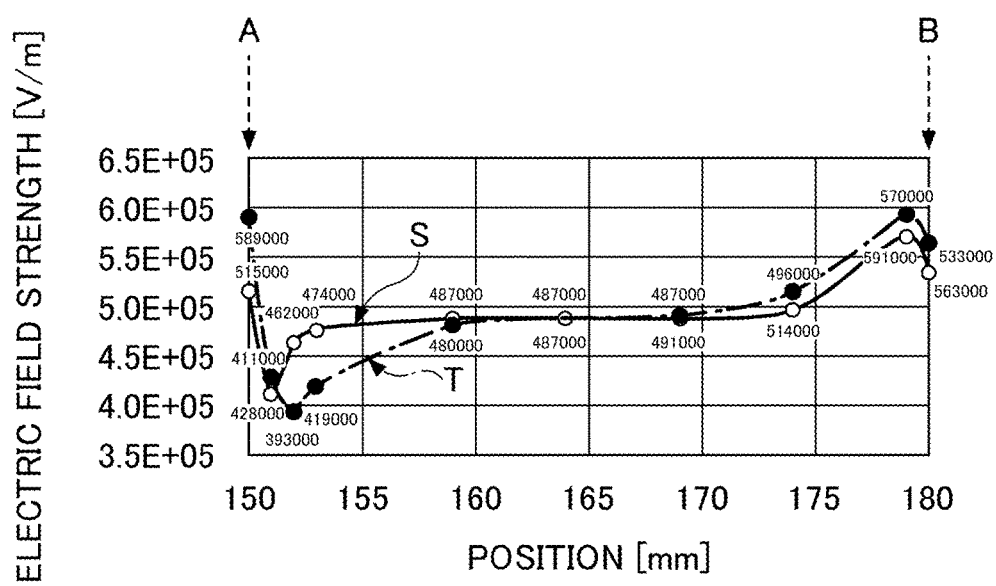
FIG. 3 is a graph illustrating an electric field strength at each of the edge ring according to one embodiment and the edge ring in the reference example.

The graph in FIG. 3 illustrates a simulation result. In the result, electric field strengths caused under a condition below, in which a radio frequency current flowed through each of the edge ring FR and the edge ring FR', are plotted with respect to radial positions of a corresponding edge ring. Where, the horizontal axis represents the radial position, and the vertical axis represents the electric field strength. On the graph, the position of 150 mm indicates a position where an edge A of a given wafer W was at a distance of 150 mm (which is a radius of the given wafer W) from the center of the given wafer W. Also, the position of 180 mm indicates a position where an outer edge B of each of the edge ring FR and the edge ring FR' was at a distance of 180 mm from the center of the given wafer W (see FIG. 1A and FIG. 1B).

<Simulation Condition>

A simulation condition was as follows.

(i) Angle (tilt angle) of the ramp surface 60a1 of the edge ring FR, relative to a horizontal plane: 3°
(ii) Angle of the surface 160a1 of the edge ring FR', relative to a horizontal plane: 0°
(iii) Etch gas: $C_4F_6$ gas and a gas mixture of $O_2$ and Ar
(vi) Pressure: 50 mTorr (6.67 Pa)
(v) Radio frequency set at the first frequency power source HFS: 100 MHz
(vi) Radio frequency set at the second frequency power source LFS: 3.2 MHz
(vii) Power at the radio frequency of 100 MHz from the first frequency power source HFS and power at the radio frequency of 3.2 MHz from the second frequency power source LFS were each supplied to a corresponding bottom electrode.

A curve S on the graph in FIG. 3 indicates the electric field strength at a radial position ranging from the edge A of a given wafer W to the outer edge B of the edge ring FR' in the reference example illustrated in FIG. 1A. In the curve S, electric field strengths were approximately the same within the range of about 153 mm to about 175 mm, which was farther outward than the stepped portion 160c that was at a position of about 153 mm.

A curve T on the graph in FIG. 3 indicates the electric field strength at a radial position ranging from the edge A of a given wafer W to the outer edge B of the edge ring FR according to embodiment described in FIG. 1B. In the curve T, the electric field strength at the inner edge-side portion and the electric field strength at the outer-side portion of the edge ring FR differed from each other, within the range of about 153 mm to about 175 mm, which was farther outward than the stepped portion 60c that was at a position of about 153 mm. In particular, within the range of about 153 mm to about 160 mm from the center of the wafer W, a lower electric field strength at the inner edge-side portion of the edge ring FR was obtained in comparison to the electric field strength at the inner edge-side portion of the edge ring FR'. Also, within the range of about 170 mm to about 180 mm from the center of the wafer W, a greater electric field strength at the outer edge-side portion of the edge ring FR was set in comparison to the electric field strength at the outer edge-side portion of the edge ring FR'.

From the above-described result, it can be seen that when the top 60a of the edge ring FR according to one embodiment had the ramp surface 60a1, the inner edge-side portion of the edge ring FR was radially located lower than the outer edge-side portion of the edge ring FR. Thus, a greater electric field strength at a given sheath toward the outer edge-side portion of the edge ring FR could be radially set in comparison to the electric field strength of a given sheath toward the inner edge-side portion of the edge ring FR. That is, as described in FIG. 1B, the edge ring FR has the ramp surface 60a1 of which the height decreases from the outer edge-side portion of the edge ring FR toward the inner edge-side portion thereof, and thus a smaller electric field strength at the inner edge-side portion of the edge ring FR can be relatively obtained in comparison to the electric field strength at the outer edge-side portion of the edge ring FR. In such a manner, energy of ions entering a given sheath toward the inner edge-side portion of the edge ring FR is decreased in comparison to energy of ions entering a given sheath toward the outer edge-side portion of the edge ring FR. Accordingly, a low consumption rate for the inner edge-side portion of the edge ring FR can be obtained in comparison to a consumption rate for the outer edge-side portion of the edge ring FR.

In such a manner, the edge ring FR according to one embodiment described in FIG. 1B has a structure in which the top 60a of the edge ring FR slopes such that the top 60a toward the inner edge-side portion is lower than the top 60a toward the outer edge-side portion. Thus, the electric field strength at the outer edge-side portion and the inner edge-side portion of the edge ring FR differ from each other. Accordingly, a given consumption rate for a portion of the edge ring FR can be adjusted intentionally.

As illustrated in the example in FIG. 2, the position Xa on the top 60a located at the inner edge-side portion of the edge ring FR, relative to the intermediate line Ax, is relatively lower than the position Xb on the top 60a located at the outer edge-side portion of the edge ring FR, relative to the intermediate line Ax. For example, for the edge ring FR according to one embodiment relating to the curve T illustrated in FIG. 3, a smaller electric field strength with respect to the position Xa (e.g., a distance of about 153 mm from the center of the wafer W), which is located at the inner edge-side portion of the edge ring FR, can be relatively obtained in comparison to an electric field strength with respect to the position Xb (e.g., a distance of about 176 mm from the center of the wafer W) on the outer edge-side portion of the edge ring FR. In contrast, for the edge ring FR' in the reference example relating to the curve S on the graph illustrated in FIG. 3, electric field strengths with respect to the position Xa on the inner edge-side portion and the position Xb on the outer edge-side portion are approximately the same.

A test for consumption of the edge ring FR' and the edge ring FR was also performed under the following condition.

<Test Condition>

(i) Angle (tilt angle) of the ramp surface 60a1 of the edge ring FR, relative to a horizontal plane: 3°
(ii) Angle of the surface 160a1 of the edge ring FR', relative to a horizontal plane: 0°
(iii) Etching object (target etching film): $SiO_2$
(iv) Etch gas: $C_4F_6$ gas and a gas mixture of $O_2$ and Ar
(v) In this test, a given substrate W was etched for 200 hours in total.

As the test result, a normalized consumption rate for the edge ring FR' was set to 1, and a ratio of a consumption rate for the edge ring FR to a consumption rate for the edge ring FR' was about 0.6 times, with respect to the position of 3 mm from the innermost circumference of each of the edge ring FR' and the edge ring FR, that is, the position of 153 mm from the center of a given wafer W. Also, with respect to the position of 4 mm from the outermost circumference of each of the edge ring FR' and the edge ring FR, that is, the position of 176 mm from the center of the given wafer W, the above ratio for consumption rates of the edge ring FR and the edge ring FR' was about 0.9 times. Also, when the test was performed under a condition in which a tilt angle θ of the ramp surface 60a1 of the edge ring FR, relative to a horizontal plane, was 7° and other parameters were set as in the above test condition, ratios for consumption rates of the edge ring FR to consumption rates for the edge ring FR' were as follows. A ratio of a consumption rate for the inner edge-side portion of the edge ring FR, to a consumption rate for the inner edge-side portion of the edge ring FR', was about 0.5 times, while a ratio of a consumption rate for the outer edge-side portion of the edge ring FR, to a consumption rate for the outer edge-side portion of the edge ring FR', was about 1.0 times. In any test case, a consumption amount (consumption rate) for the inner edge-side portion of the edge ring FR was smaller in comparison to the consumption amount (consumption rate) for the outer edge-side portion of the edge ring FR.

In the edge ring FR according to one embodiment, a greater height of the top 60a provided toward the outer edge-side portion of the edge ring FR is set in comparison to a height of the top provided toward the inner edge-side portion of the edge ring FR. In such a manner, a smaller consumption amount (consumption rate) for the inner edge-side portion of the edge ring FR near a given wafer W can be obtained in comparison to the case where the edge ring FR', as illustrated in the reference example, has the top of which the height is constant. In other words, in the edge ring FR according to one embodiment, a lower consumption rate for the inner edge-side portion of the edge ring FR can be obtained in comparison to the consumption rate for the outer edge-side portion of the edge ring FR.

In this regard, in the edge ring FR, when parameters (i) to (iv) below are given, the relation "(T1−T3)<(T2−T4)" is satisfied, where "T1−T3" indicates a consumption amount (consumption rate) for the inner edge-side portion of the edge ring FR, and "T2−T4" indicates a consumption amount (consumption rate) for the outer edge-side portion of the edge ring FR.
(i) Thickness of the edge ring FR, before plasma treatment, at the position Xa: T1
(ii) Thickness of the edge ring FR, before plasma treatment, at the position Xb on the ramp surface 60a1 of the top 60a toward the outer edge-side portion, relative to the intermediate line Ax: T2
(iii) Thickness of the edge ring FR, after plasma treatment, at the position Xa: T3
(iv) Thickness of the edge ring FR, after plasma treatment, at the position Xb on the ramp surface 60a1 of the top 60a toward the outer edge-side portion, relative to the intermediate line Ax: T4

Also, when the relation "(T1−T3)<(T2−T4)" is satisfied, the tilt of ions from a plasma is reduced. In such a manner, etching can be vertically performed with respect to the edge of a given wafer W. Thus, plane uniformity within the given wafer W by etching is improved. Moreover, a life of the edge ring FR is increased by intentionally adjusting a consumption rate for a portion of the edge ring FR. Advantageously, manufacturing costs are also reduced. Moreover, variations in a tilt amount of ions for an n-th (n≥1) wafer W and an (n+1)-th wafer W can be reduced.

Figures 4A, 4B:
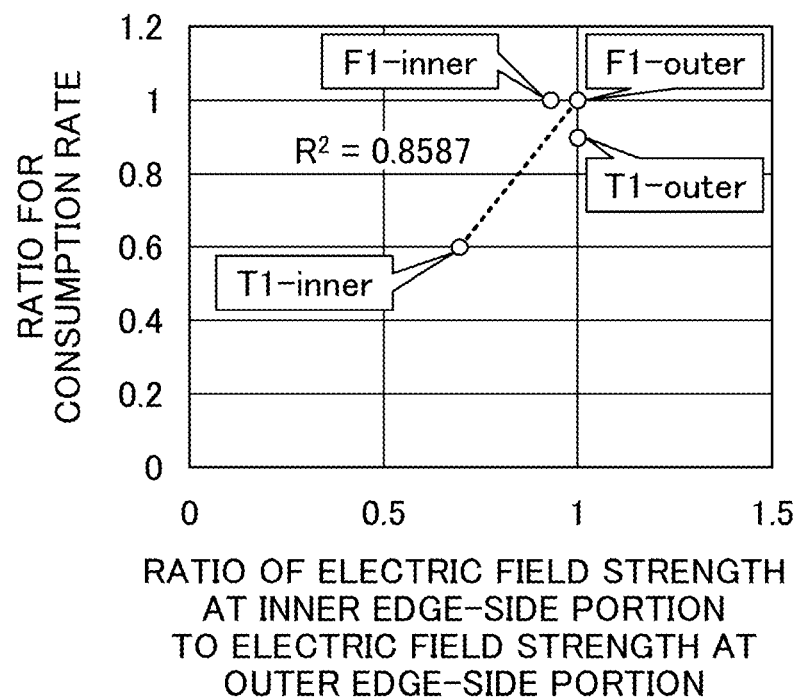
FIGS. 4A and 4B are diagrams illustrating the relation between a ratio for the electric field strength and a ratio for a consumption rate, of an inner edge-side portion to an outer edge-side portion of each of the edge ring according to one embodiment and the edge ring in the reference example.

FIG. 4A and FIG. 4B illustrate the correlation between the ratio for an electric field strength and the ratio for a consumption rate, and the correlation is determined based on the simulation result illustrated in FIG. 3 and the test result described above. Each of the simulation result and the test result was obtained by using the edge ring FR according to one embodiment described in FIG. 1B and the edge ring FR' in the reference example in FIG. 1A. As illustrated in FIG. 1B, in the edge ring FR, only the ramp surface 60a1 of the top 60a was ramped and the second surface 60a2 was a horizontal plane. In contrast, as illustrated in FIG. 1A, in the edge ring FR', the top 160a was flat.

FIG. 4A is a graph illustrating the relation between the ratio for the electric field strengths and the ratio for the consumption rate, with respect to each of the edge ring FR and the edge ring FR'. In FIG. 4A, as described in the simulation result (FIG. 3), the horizontal axis represents the ratio of an electric field strength for the edge ring FR to an electric field strength for the edge ring FR', with respect to each of the inner edge-side portion and the outer edge-side portion of the edge ring FR, where the electric field strength is caused by the frequency radio current flowing through a corresponding edge ring among the edge ring FR and the edge ring FR'. Also, the vertical axis represents the ratio of a consumption rate for the edge ring FR to a consumption rate for the edge ring FR', with respect to each of the inner edge-side portion and the outer edge-side portion of the edge ring FR. Note that in FIG. 4A, for a given position on a given inner edge-side portion, the position of 153 mm from the center of the wafer W was adopted. Also, for a given position on a given outer edge-side portion, the position of 176 mm from the center of the wafer W was adopted. In FIGS. 4A and 4B, as described above, a normalized consumption amount of the outer edge-side portion of the edge ring FR' illustrated in FIG. 1A was set to "1", which was expressed as a ratio for a given consumption rate for the outer edge-side portion of the edge ring FR'. Also, a normalized electric field strength at the outer edge-side portion of the edge ring FR' was set to "1", which was expressed as a ratio for a given electric field strength at the outer edge-side portion of the edge ring FR'. In FIG. 4A and FIG. 4B, "F1-inner" indicates the inner edge-side portion of the edge ring FR', "F1-outer" indicates the outer edge-side portion of the edge ring FR'. Also, "T1-inner" indicates the inner edge-side portion of the edge ring FR, and "T1-outer" indicates the outer edge-side portion of the edge ring FR.

As illustrated in FIG. 4A and FIG. 4B, in the edge ring FR' in the reference example, a given ratio for the electric strength and a given ratio for the consumption rate, of the inner edge-side portion (F1-inner) to the outer edge-side portion (F1-outer), were approximately the same. In contrast, although in the edge ring FR according to one embodiment, the electric field strength at the outer edge-side portion (T1-outer) of the edge ring FR was the same as the electric field strength at the outer edge-side portion (F1-outer) of the edge ring FR' in the reference example, a given ratio of the electric field strength at the inner edge-side portion (T1-inner) of the edge ring FR, to the electric field strength at each of the outer edge-side portion (F1-outer) of the edge ring FR' and the electric field strength at the outer edge-side portion (T1-outer) of the edge ring FR, was 0.7 times. Moreover, for the edge ring FR according to one embodiment, a ratio of the consumption rate for the outer edge-side portion (T1-outer) of the edge ring FR, to the consumption rate for the outer edge-side portion (F1-outer) of the edge ring FR', was 0.9 times. Also, a ratio of the consumption rate for the inner edge-side portion (T1-inner) of the edge ring FR, to the consumption rate for the outer edge-side portion (F1-outer) of the edge ring FR', was 0.6 times.

In other words, for the edge ring FR, a given ratio for the consumption rate was decreased as the ratio for a given relative height, from the wafer W, of the edge ring FR decreased. Further, in the edge ring FR, a smaller height of the inner edge-side portion of the edge ring FR relative to the wafer W was relatively set in comparison to the height of the outer edge-side portion of the edge ring FR relative to the wafer W. Thus, a given ratio of the electric field strength at the inner edge-side portion of the edge ring FR, to the electric field strength at the outer edge-side portion of the edge ring FR was reduced. Accordingly, a given ratio for the consumption rate for the edge ring FR could be also reduced.

As described above, by changing the ratio for a given relative height, from the wafer W, of the edge ring FR, a given ratio for the electric field strength and a given ratio for the consumption rate, of the inner edge-side portion to the outer edge-side portion of the edge ring FR, could change.

Thus, a given consumption amount of the inner edge-side portion of the edge ring FR could be reduced.

Hereafter, the edge ring according to first to fourth embodiments will be described.

First Embodiment

Figure 5:
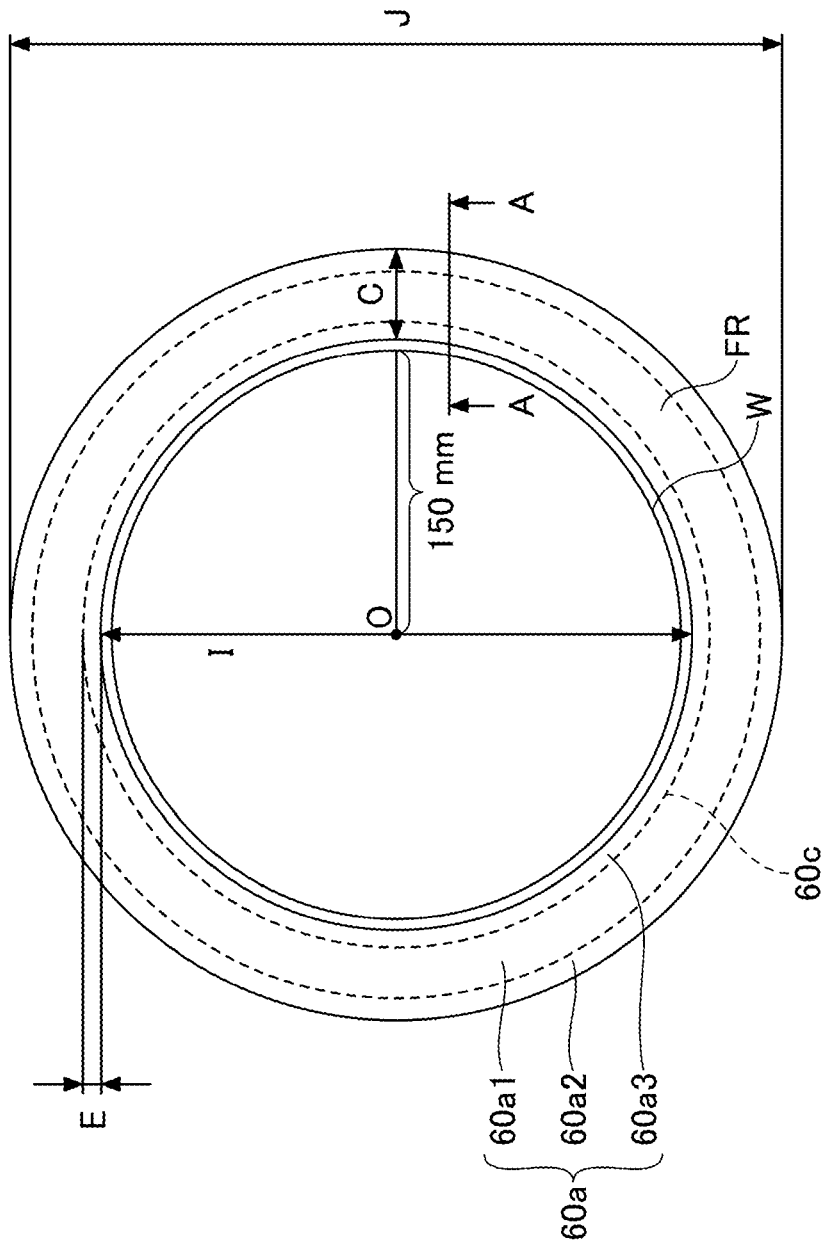
FIG. 5 is a plan view illustrating an example of the edge ring according to a first embodiment.
Figure 6:
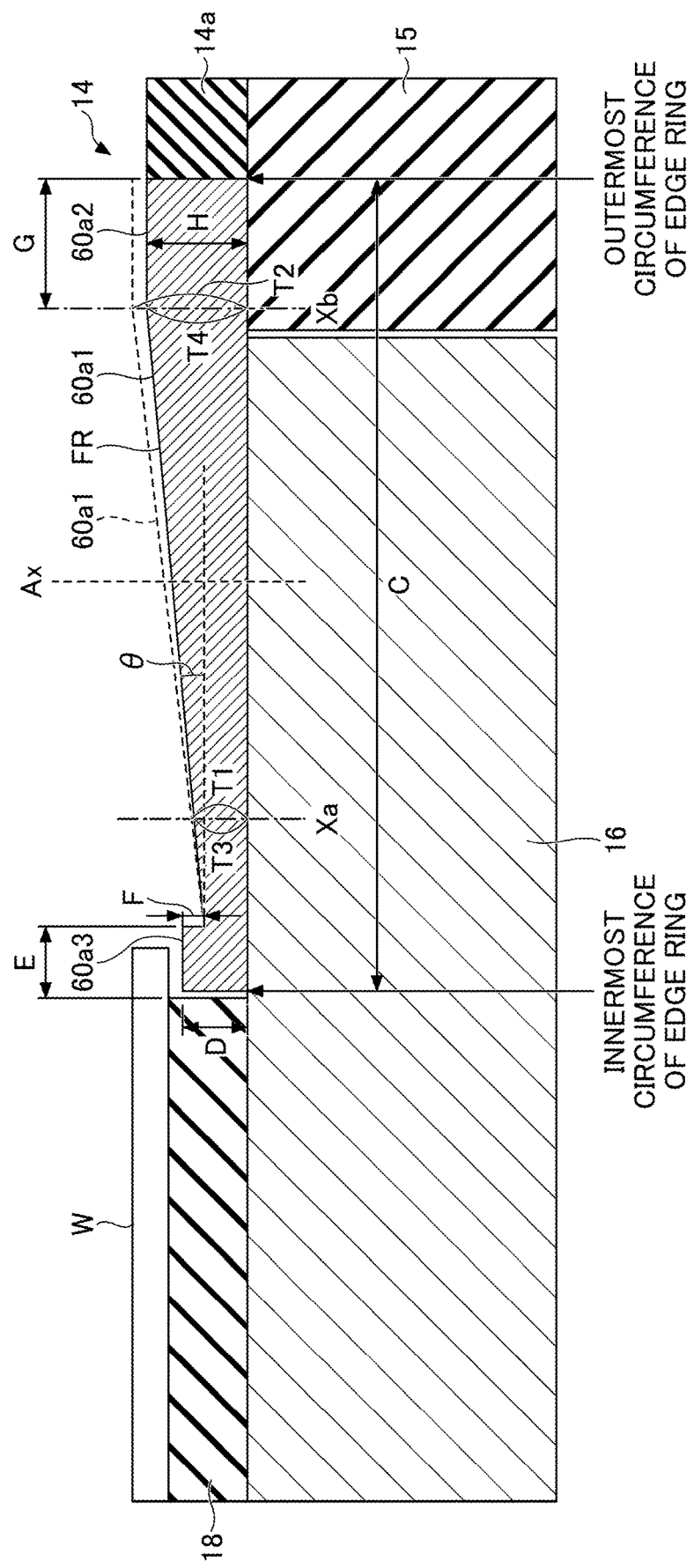
FIG. 6 is a cross-sectional view illustrating an example of the edge ring taken along the A-A line in FIG. 5.

The edge ring FR according to the first embodiment will be described with reference to FIG. 5 and FIG. 6. FIG. 5 is a plan view illustrating an example of the edge ring FR according to the first embodiment. FIG. 6 is a cross-sectional view illustrating an example of the edge ring FR according to the first embodiment taken along the A-A line illustrated in FIG. 5.

As illustrated in FIG. 5, in the first embodiment, the edge ring FR is disposed to surround an outer edge of a given wafer W having a radius of about 150 mm. An axis of the edge ring FR is common to a central axis O of the given wafer W, and the edge ring FR is approximately arranged concentrically.

An inner diameter I of the edge ring FR is from about 300 mm to about 305 mm, and an outer diameter J of the edge ring FR is from about 360 mm to 365 mm. A radial width C of the edge ring FR is from about 28 mm to 32 mm. A radial width E of the edge ring FR from the innermost circumference of the edge ring FR to the stepped portion 60c may be between about 1 mm and about 2 mm, inclusive.

The top 60a of the edge ring FR has the ramp surface 60a1 and the second surface 60a2, which are outside the stepped portion 60c. The top 60a of the edge ring FR has the first surface 60a3 inside the stepped portion 60c. The first surface 60a3 and the second surface 60a2 of the edge ring FR are flat, and the ramp surface 60a1 of the edge ring FR is uniformly ramped. The top 60a of the edge ring FR may be partially inclined, or may be entirely inclined. In such a manner, the second surface 60a2 of the edge ring FR may be a ramp surface or a horizontal plane. In the example in FIG. 6 illustrating the cross section of the edge ring FR taken along the A-A line in FIG. 5, the second surface 60a2 is a horizontal plane.

A radial width G of the second surface 60a2 measured inward from the outermost circumference of the edge ring FR is between about 5 mm and about 7 mm, inclusive. A radial width of the ramp surface 60a1 of the edge ring FR may be between about 20 mm and about 30 mm, inclusive. In the present disclosure, the ramp surface 60a1 of the edge ring FR may be a uniformly ramped surface that is gradually lowered from the outer edge-side portion toward the inner edge-side portion, where a tilt angle θ (°) of the ramp surface 60a1, relative to a horizontal plane, is between 2.5° and 10°, inclusive. When the tilt angle θ (°) is less than 2.5°, consumption of the inner edge-side portion of the edge ring FR might be not sufficiently reduced, and if the tilt angle exceeds 10°, plane uniformity within a given wafer at an early phase (before the outer edge-side portion of the edge ring is consumed) of a substrate process might deteriorate (which might result in difficulty in reducing the tilt of ions from a plasma). As the above tilt angle θ increases, distortion of a given sheath at a lower end is increased, and consequently it might be difficult to reduce the tilt of the ions (i.e., the tilt of the ions that are incident outside a given edge region of the wafer W might be increased). For this reason, for example, the tilt angle θ is set to 10° or less. In light of the two issues described above, i.e., issues on the tilt of the ions and consumption of the inner edge-side portion of a given edge ring, the tilt angle θ (°) is more preferably between 3° and 7°, inclusive. For example, by setting the tilt angle θ (°) to 3° or greater, a ratio of the radio frequency current flowing through the inner edge-side portion of the edge ring FR, to the radio frequency current flowing through the outer edge-side portion of the edge ring FR, is decreased. Thus, consumption of the inner edge-side portion of the edge ring FR can be sufficiently reduced. Also, for example, by setting the tilt angle θ (°) to 7° or less, an increase in a tilt amount of ions from a plasma, relative to the edge of a given wafer W, can be prevented. Thus, the edge of the given wafer W, as well as the plane within the given wafer W, can be etched vertically.

A thickness D of the edge ring FR on the innermost circumference thereof is about 3 mm. A maximum thickness H of the edge ring FR on the outermost circumference thereof is between about 3.5 mm and about 7.0 mm, inclusive. A height F of the stepped portion 60c is about 0.2 mm.

In the example in FIG. 6, the height of the ramp surface 60a1 of the edge ring FR, which is measured before plasma treatment, is expressed by a dashed line, and the height of the ramp surface 60a1 of the edge ring FR, which is measured after plasma treatment, is expressed by a solid line. The edge ring FR before plasma treatment may mean an unused (new) edge ring FR. Also, the edge ring FR after plasma treatment may mean a consumed edge ring FR, i.e., the edge ring FR consumed by plasma treatment (e.g., at a timing at which the edge ring is replaced with a new edge ring).

Parameters illustrated in FIG. 6 are given as follows.

(i) Position on the ramp surface 60a1 of the top 60a located toward the inner edge-side portion of the edge ring FR, relative to an intermediate line Ax: Xa, where the intermediate line Ax is equidistant from the innermost circumference and the outermost circumference of the edge ring FR, when the edge ring FR is viewed from a horizontal direction.

(ii) Thickness of the edge ring FR, before plasma treatment, at the position Xa: T1

(iii) Position on the ramp surface 60a1 of the top 60a located toward the outer edge-side portion of the edge ring FR, relative to the intermediate line Ax: Xb (iv) Thickness of the edge ring FR, before plasma treatment, at the position Xb: T2

(v) Thickness of the edge ring FR, after plasma treatment, at the position Xa: T3

(vi) Thickness of the edge ring FR, after plasma treatment, at the position Xb: T4

When the parameters (i) to (vi) are given, the relation "T2/T1>T4/T3" is satisfied.

Second to Fourth Embodiments

Figure 7A:
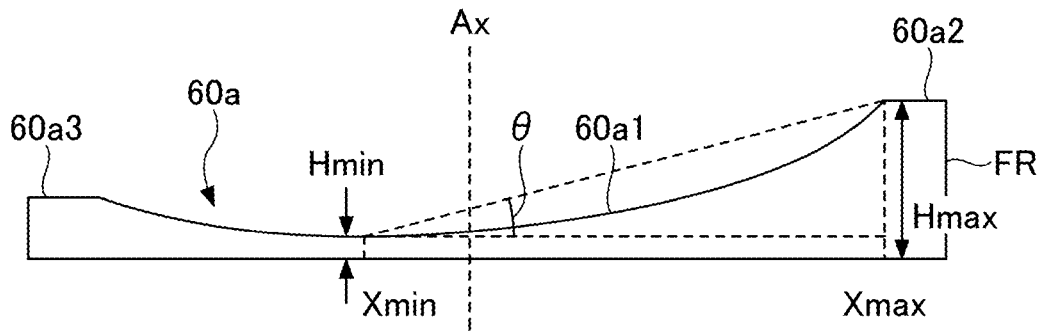
FIGS. 7A to 7C are cross-sectional views illustrating an example of edge rings according to second to fourth embodiments.
Figure 7B:
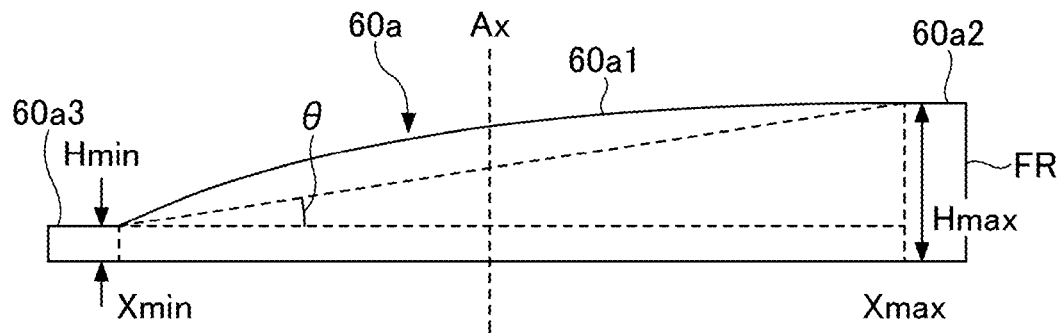
Figure 7C:
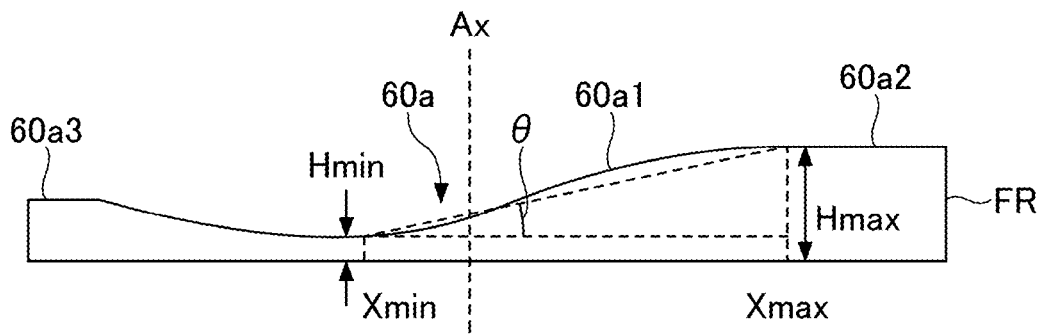

Hereafter, edge rings FR according to second to fourth embodiments will be described with reference to FIGS. 7A to 7C. FIGS. 7A to 7C are cross-sectional views illustrating an example of the edge rings FR according to the second to fourth embodiments. The second to fourth embodiments differ from the first embodiment in that the ramp surface 60a1 of the top 60a of a given edge ring FR is not uniformly ramped. Other configurations of the edge ring FR according to each of the second to fourth embodiments are the same as in the edge ring according to the first embodiment. For example, in the second to fourth embodiments, the ramp surface 60a1 of the given edge ring FR may be any of a uniformly ramped surface, an inward curved surface, an outward curved surface, or a curved surface.

In the second embodiment, as illustrated in FIG. 7A, the ramp surface 60a1 of the edge ring FR is curved inward. In the third embodiment, as illustrated in FIG. 7B, the ramp surface 60a1 of the edge ring FR is curved outward. In the fourth embodiment, as illustrated in FIG. 7C, the ramp surface 60a1 of the edge ring FR toward the outer edge-side portion is curved outward, while the ramp surface 60a1 of the edge ring FR toward the outer edge-side portion is curved inward.

In the second to fourth embodiments, parameters are given as follows.
(i) Maximum height from the bottom of the edge ring FR to the ramp surface 60a1 thereof: Hmax
(ii) Minimum height from the bottom of the edge ring FR to the ramp surface 60a1 thereof: Hmin
(iii) Position on a given horizontal plane corresponding to the maximum height Hmax: Xmax
(iv) Position on the given horizontal plane corresponding to the minimum height Hmin: Xmin When the parameters (i) to (iv) are given, $\tan \theta$ is expressed as $\theta = (Hmax - Hmin)/(Xmax - Xmin)$. In the edge ring FR according to each of the second to fourth embodiments, $\tan \theta$ is set between a value derived from 9/210, and a value derived from 37/210, inclusive.

[Etching Apparatus]

Hereafter, an example of an etching apparatus 10 in which the edge ring FR described in one or more embodiments is disposed will be described with reference to FIG. 8. FIG. 8 is a cross-sectional view schematically illustrating an example of the etching apparatus 10 according to one embodiment. The etching apparatus 10 exposes a wafer W to a plasma of process gas (etch gas) to thereby etch a target etching film. In such a manner, holes are formed in the target etching film.

The etching apparatus 10 is a capacitively coupled plasma etching apparatus, and includes a generally cylindrical plasma processing chamber 12. The surface of the plasma processing chamber 12 is formed of, for example, anodized aluminum. The plasma processing chamber 12 is grounded.

The cylindrical support 15, which is formed of an insulating material, is disposed on the bottom of the plasma processing chamber 12. The base 16 is supported at an inner wall surface of the support 15. A ring assembly 14 is disposed on a top of the support 15. The base 16 is formed of a metal such as aluminum, and is generally disk-shaped.

The first radio frequency power source HFS is connected to the base 16 via a matching device MU1. The first radio frequency power source HFS is a power source that generates radio frequency power for forming a plasma. The generated power is set at frequencies in the range of 27 MHz to 100 MHz. For example, the power is set at a frequency of 100 MHz. The matching device MU1 includes a circuit for matching between an output impedance of the first radio frequency power supply HFS and an input impedance of a load side (base 16 side).

A second radio frequency power source LFS is connected to the base 16 via a matching device MU2. The second radio frequency power source LFS generates radio frequency power (radio frequency bias power) for drawing ions into a wafer W, and then supplies the radio frequency bias power to the base 16. The bias power is set at frequencies in the range of 400 kHz to 13.56 MHz. For example, the bias power is set at a frequency of 3.2 MHz. The matching device MU2 includes a circuit for matching between an output impedance of the second RF power source LFS and a given input impedance of the load side (base 16 side).

Note, however, that the first radio frequency power source HFS and the second radio frequency power source LFS are not limited to the manner coupled to the base 16 (bottom electrode). The first radio frequency power source HFS may be coupled to a top electrode 30 described below, and the second radio frequency power source LFS may be coupled to the bottom electrode.

An electrostatic chuck 18 is provided on the base 16. A substrate support ST includes the bottom electrode and the electrostatic chuck 18. The electrostatic chuck 18 and the base 16 constitute a stage for supporting the wafer W. The electrostatic chuck 18 has a structure in which an electrode 20 is disposed between a pair of insulating layers or sheets, and the electrode 20 is a conductive film. A DC power source 22 is electrically connected to the electrode 20. The electrostatic chuck 18 can attract and hold the wafer W by an electrostatic force such as a coulomb force caused by a DC voltage from the DC power source 22.

A focus ring FR according to one embodiment is disposed on the top of the base 16, so as to encircle the electrostatic chuck 18. In FIG. 8, the shape of the focus ring FR is schematically illustrated.

A flow path 24 is provided within the base 16. With use of the flow path 24, a temperature-controlled medium, such as cooling water, of a predetermined temperature is circulated by an external chiller unit through pipes 26a and 26b. By adjusting the temperature of the temperature-controlled medium circulated in such a manner, the temperature of the wafer W mounted on the electrostatic chuck 18 is adjusted.

In the etching apparatus 10, a gas supply line 28 is also provided. The gas supply line 28 is used to supply heat transfer gas from a heat transfer gas supply, to a portion between the top of the electrostatic chuck 18 and the bottom of the wafer W. For example, the heat transfer gas is He gas.

The etching apparatus 10 also includes a top electrode 30. The top electrode 30 is disposed above the base 16 so as to face the base 16. The base 16 and the top electrode 30 are provided substantially parallel to each other. A processing space S for etching the given wafer W is defined between the top electrode 30 and the base 16.

The top electrode 30 is supported on the top of the plasma processing chamber 12 through an insulating shield member 32. The top electrode 30 may include an electrode plate 34 and an electrode support 36. The electrode plate 34 faces a process space S and defines gas discharging holes 34a. The electrode plate 34 may be formed of a conductor or a semiconductor with low electrical resistance and low Joule heat.

The electrode support 36 releasably supports the electrode plate 34, and may be formed of a conductive material such as aluminum. The electrode support 36 may have a water-cooled structure. A gas diffusion compartment 36a is provided in an interior of the electrode support 36. Gas flow holes 36b communicating with the respective gas discharge holes 34a extend downwardly from the gas diffusion compartment 36a. The electrode support 36 has a gas inlet 36c for supplying process gas to the gas diffusion compartment 36a, and a gas supply pipe 38 is connected to the gas inlet 36c.

A gas source group 40 is connected to the gas supply line 38 via a valve group 42 and a flow controller group 44. The gas source group 40 includes gas sources. The flow controller group 44 includes flow controllers, and each flow controller may be a mass flow controller. The valve group 42 includes valves, and the valves are respectively connected to the flow controllers.

In the etching apparatus 10, gas from a gas source selected from among the gas source group is supplied to the gas supply line 38 via a corresponding flow controller and valve, while a flow of the gas is controlled. The gas supplied to the gas supply line 38 reaches the gas diffusion compartment 36a and then is discharged into the process space S via the gas flow inlet 36b and the gas discharge holes 34a.

The etching apparatus 10 may also include a ground conductor 12a. The ground conductor 12a is a generally cylindrical ground conductor. The ground conductor 12a is provided to extend from a sidewall of the plasma processing chamber 12, so as to be situated at a higher level than the top electrode 30.

Moreover, in the etching apparatus 10, a shield 46 against deposits is removably mounted along an inner wall of the plasma processing chamber 12. The shield 46 is also provided on the outer periphery of the support 15. The shield 46 prevents byproducts (deposits) caused by an etch from adhering to the plasma processing chamber 12. The shield 46 may be configured by coating aluminum with a ceramic such as $Y_2O_3$.

On a bottom side of the plasma processing chamber 12, an exhaust plate 48 is provided between the support 15 and the inner wall of the plasma processing chamber 12. For example, the exhaust plate 48 may be constructed by coating aluminum with a ceramic such as $Y_2O_3$. An exhaust port 12e is provided below the exhaust plate 48 in the plasma processing chamber 12. An exhausting device 50 is connected to the exhaust port 12e through an exhaust pipe 52. The exhausting device 50 includes a vacuum pump, such as a turbomolecular pump, which can depressurize the plasma processing chamber 12 up to a desired vacuum level. A loading port 12g for the substrate W is provided at a given sidewall of the plasma processing chamber 12, and a gate valve 54 is used to open or close the loading port 12g.

A conductive member (GND block) 56 is provided on the inner wall of the plasma processing chamber 12. The conductive member 56 is attached to the inner wall of the plasma processing chamber 12 so as to be located at a height approximately the same as the wafer W in a height direction. The conductive member 56 is connected to a ground so as to constitute an equivalent DC circuit. In such a manner, abnormal discharge is prevented.

The etching apparatus 10 may further include a controller Cnt. The controller Cnt is implemented by a computer including a processor, a storage, an input device, a display device, and the like, and controls each component of the etching apparatus 10. In the controller Cnt, the input device can be used to perform an operation such as the input of commands, in order for an operator to manage the etching apparatus 10. The display device can be used to visually display an operation status of the etching apparatus 10. The storage of the controller Cnt stores a process recipe. The process recipe may include a control program that causes a processor of the etching apparatus 10 to control various processes. The process recipe may also include a program that causes each component of the etching apparatus 10 to perform a process under a process condition.

The edge ring FR according to one embodiment can be disposed in the etching apparatus 10. Except for the configuration of the etching apparatus 10 proximal to the edge ring FR, other configurations of the etching apparatus 10 can be adopted as in the apparatus described in FIG. 8 of Japanese Unexamined Patent Application Publication No. 2015-41624 (which corresponds to U.S. Publication No. 2015056808 A1). Note, however, that the etching apparatus 10 is not limiting and may be applicable to any of the following types of devices: an inductively coupled plasma (ICP), a radial line slot antenna (RLSA), an electron cyclotron resonance plasma (ECR), or a helicon wave plasma (HWP).

As described above, according to the edge ring FR and the edging apparatus 10 according to one or more embodiments, a greater electric field strength at the outer edge-side portion of the edge ring FR is relatively set in comparison to the electric field strength of the inner edge-side portion of the edge ring FR near the edge region of a given wafer W. In such a manner, the electric field strength at the inner edge-side portion of the edge ring FR is relatively decreased. Thus, ion energy made at the inner edge-side portion of the edge ring FR at which a relatively low field strength is caused is decreased. Accordingly, a given consumption rate for the edge ring FR is reduced. Specifically, a greater thickness of the outer edge-side portion of the edge ring FR is set in comparison to the thickness of the inner edge-side portion of the edge ring FR, and thus consumption of the inner edge-side portion of the edge ring FR near the given wafer W can be reduced. Moreover, performance in adjusting the tilt of ions from a plasma can be improved.

The disclosed embodiments further may involve the following manners.

(Manner 1) An edge ring to encircle an etching object supported by a substrate support in a plasma processing chamber, the edge ring including:

an inner edge-side portion toward the innermost circumference of the edge ring, relative to an intermediate line that is equidistant from the innermost circumference and the outermost circumference of the edge ring; and an outer edge-side portion toward the outermost circumference of the edge ring, relative to the intermediate line, wherein the inner edge-side portion and the outer edge-side portion have a ramp surface of which a height decreases from the outer edge-side portion toward the inner edge-side portion, wherein the edge ring is configured to satisfy the relation of T1−T3>T2−T4, and wherein T1 is a thickness of the edge ring, before plasma treatment, at a position Xa on the ramp surface of the inner edge-side portion, T2 is a thickness of the edge ring, before plasma treatment, at a position Xb on the ramp surface of the outer edge-side portion, T3 is a thickness of the edge ring, after plasma treatment, at the position Xa, and T4 is a thickness of the edge ring, after plasma treatment, at the position Xb.

(Manner 2) The edge ring according to manner 1, wherein an angle of the ramp surface of the edge ring, relative to a horizontal plane, is between 3° and 7°.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

According to the present disclosure, an edge ring capable of reducing consumption of an inner edge-side portion is provided.

What is claimed is:

1. An edge ring to encircle an etching object supported by a substrate support in a plasma processing chamber, the edge ring comprising:

an inner edge-side portion toward the innermost circumference of the edge ring, relative to an intermediate line that is equidistant from the innermost circumference and the outermost circumference of the edge ring; and an outer edge-side portion toward the outermost circumference of the edge ring, relative to the intermediate line, wherein the inner edge-side portion and the outer edge-side portion have a ramp surface of which a height decreases from the outer edge-side portion toward the inner edge-side portion, wherein the edge ring is configured to satisfy the relation of T2/T1>T4/T3, and wherein T1 is a thickness of the edge ring, before plasma treatment, at a first position on the ramp surface of the inner edge-side portion, T2 is a thickness of the edge ring, before plasma treatment, at a second position on the ramp surface of the outer edge-side portion, T3 is a thickness of the edge ring, after plasma treatment, at the first position, and T4 is a thickness of the edge ring, after plasma treatment, at the second position.

2. The edge ring according to claim 1, wherein the edge ring used before the plasma treatment is an unused edge ring to be provided in an etching apparatus, and wherein the edge ring after the plasma treatment is an edge ring used in the etching apparatus.

3. The edge ring according to claim 1, further comprising a stepped portion provided at a top of the edge ring, wherein the ramp surface of the edge ring is partially or entirely provided farther outward than the stepped portion.

4. The edge ring according to claim 1, wherein the edge ring is formed of Si or SiC.

5. The edge ring according to claim 1, wherein the etching object is configured to, upon occurrence of a condition in which the etching object is held on the substrate support, be disposed such that an edge of the etching object extends beyond an inner circumferential surface of the edge ring, and wherein the ramp surface of the edge ring is located farther outward than the outer edge of the etching object.

6. An etching apparatus comprising:

a plasma processing chamber;

a substrate support provided in the plasma processing chamber;

an edge ring to encircle an etching object supported by the substrate support, the edge ring including;

an inner edge-side portion toward the innermost circumference of the edge ring, relative to an intermediate line that is equidistant from the innermost circumference and the outermost circumference of the edge ring; and an outer edge-side portion toward the outermost circumference of the edge ring, relative to the intermediate line, wherein the inner edge-side portion and the outer edge-side portion have a ramp surface of which a height decreases from the outer edge-side portion toward the inner edge-side portion, wherein the edge ring is configured to satisfy the relation of T2/T1>T4/T3, and wherein T1 is a thickness of the edge ring, before plasma treatment, at a first position on the ramp surface of the inner edge-side portion, T2 is a thickness of the edge ring, before plasma treatment, at a second position on the ramp surface of the outer edge-side portion, T3 is a thickness of the edge ring, after plasma treatment, at the first position, and T4 is a thickness of the edge ring, after plasma treatment, at the second position.

* * * * *